US012688348B2

(12) United States Patent
Lin et al.

(10) Patent No.: US 12,688,348 B2
(45) Date of Patent: Jul. 21, 2026

(54) NETWORKING DETECTION METHOD AND SYSTEM

(71) Applicant: S2C LIMITED, Shanghai (CN)

(72) Inventors: Kaipeng Lin, Shanghai (CN); Hui Xiao, Shanghai (CN)

(73) Assignee: S2C LIMITED, Shanghai (CN)

( * ) Notice: Subject to any disclaimer, the term of this patent is extended or adjusted under 35 U.S.C. 154(b) by 595 days.

(21) Appl. No.: 18/262,198

(22) PCT Filed: Oct. 27, 2021

(86) PCT No.: PCT/CN2021/126672
§ 371 (c)(1),
(2) Date: Jul. 20, 2023

(87) PCT Pub. No.: WO2022/156296
PCT Pub. Date: Jul. 28, 2022

(65) Prior Publication Data
US 2024/0281585 A1     Aug. 22, 2024

(30) Foreign Application Priority Data

Jan. 20, 2021     (CN) .......................... 202110072195.0

(51) Int. Cl.
*G06F 30/30*          (2020.01)
*G06F 30/343*         (2020.01)

(52) U.S. Cl.
CPC .................................. *G06F 30/343* (2020.01)

(58) Field of Classification Search
USPC .................................. 716/101, 102, 104, 106
See application file for complete search history.

(56) References Cited

U.S. PATENT DOCUMENTS

2011/0219208 A1* 9/2011 Asaad ........................ G06F 9/06
                                              712/12
2014/0331135 A1* 11/2014 Sukoff .................. H04L 65/764
                                              715/719

FOREIGN PATENT DOCUMENTS

CN          1737600 A      2/2006
CN        105717406 A      6/2016
              (Continued)

OTHER PUBLICATIONS

International Search Report received in the corresponding international application PCT/CN2021/126672, mailed Jan. 20, 2022.

*Primary Examiner* — Brian Ngo
(74) *Attorney, Agent, or Firm* — Kilpatrick Townsend & Stockton LLP

(57)          ABSTRACT

A networking detection method and system, relating to the technical field of electronic design automation. The method specifically comprises: an upper computer (2) allocating identifier information for each system single board (1), programmable logic array (4), and signal channel, and loading the identifier information into a corresponding controller (3) (S1); uniformly setting the signal channel to a signal receiving mode (S2); detecting whether the signal channel receives a data packet (S3); and generating one interconnection data, the upper computer (2) obtaining interconnection information according to processed interconnection data, and generating a hardware system description language file for describing networking connection (S8). By means of the processing solution, manual measurement and input are not needed, no limitation is caused by a development board installation environment, the generation speed is high, the precision is high, and a faulty cable can be accurately positioned.

10 Claims, 6 Drawing Sheets

(56)  References Cited

FOREIGN PATENT DOCUMENTS

| | | | |
|---|---|---|---|
| CN | 110611507 | A | 12/2019 |
| CN | 110907857 | A | 3/2020 |
| CN | 112118166 | A | 12/2020 |
| CN | 112394300 | A | 2/2021 |

* cited by examiner

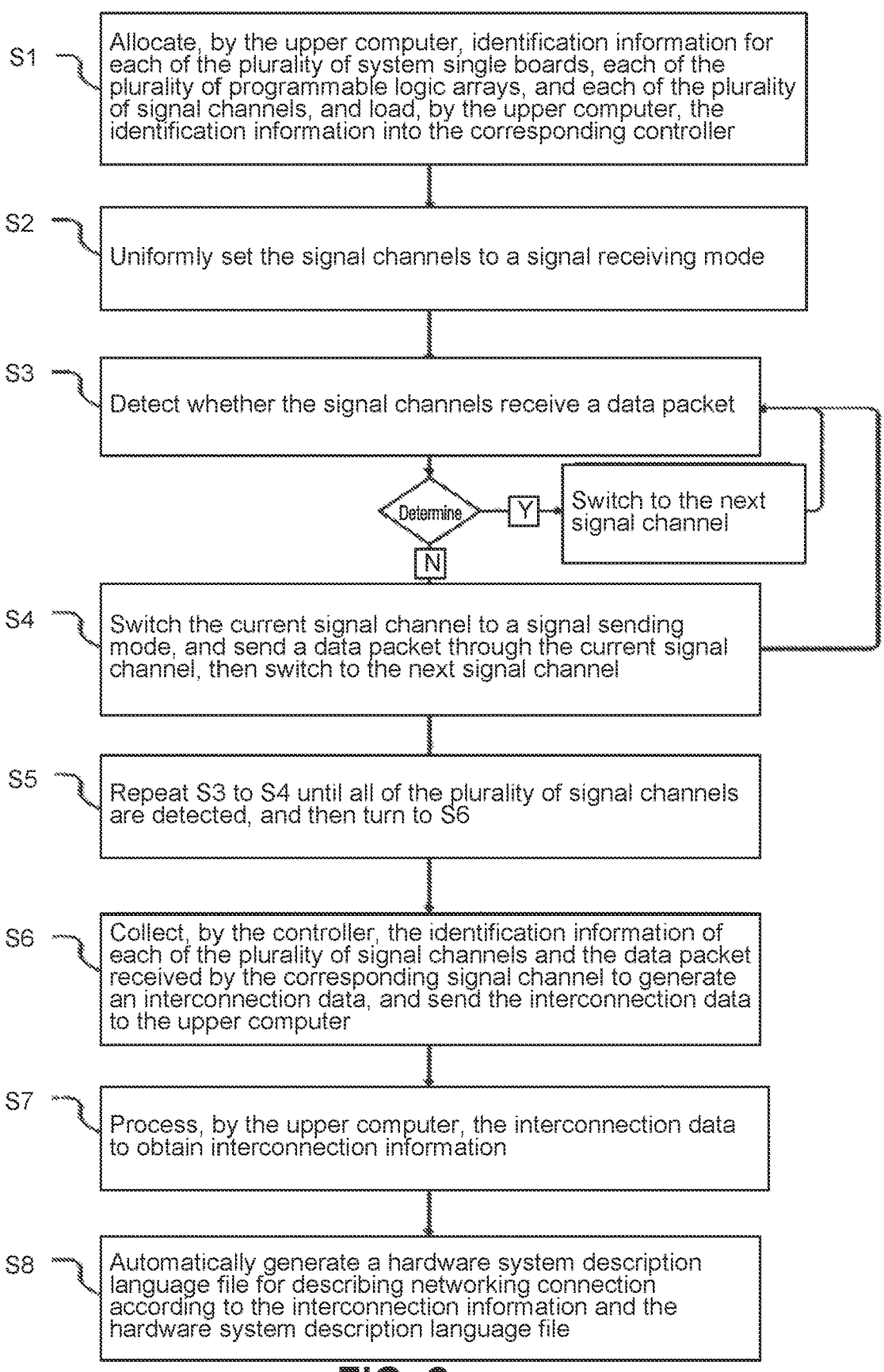

S1 — Allocate, by the upper computer, identification information for each of the plurality of system single boards, each of the plurality of programmable logic arrays, and each of the plurality of signal channels, and load, by the upper computer, the identification information into the corresponding controller S2 — Uniformly set the signal channels to a signal receiving mode S3 — Detect whether the signal channels receive a data packet Determine → Y → Switch to the next signal channel

N

S4 — Switch the current signal channel to a signal sending mode, and send a data packet through the current signal channel, then switch to the next signal channel S5 — Repeat S3 to S4 until all of the plurality of signal channels are detected, and then turn to S6

S6 — Collect, by the controller, the identification information of each of the plurality of signal channels and the data packet received by the corresponding signal channel to generate an interconnection data, and send the interconnection data to the upper computer S7 — Process, by the upper computer, the interconnection data to obtain interconnection information S8 — Automatically generate a hardware system description language file for describing networking connection according to the interconnection information and the hardware system description language file

FIG. 2

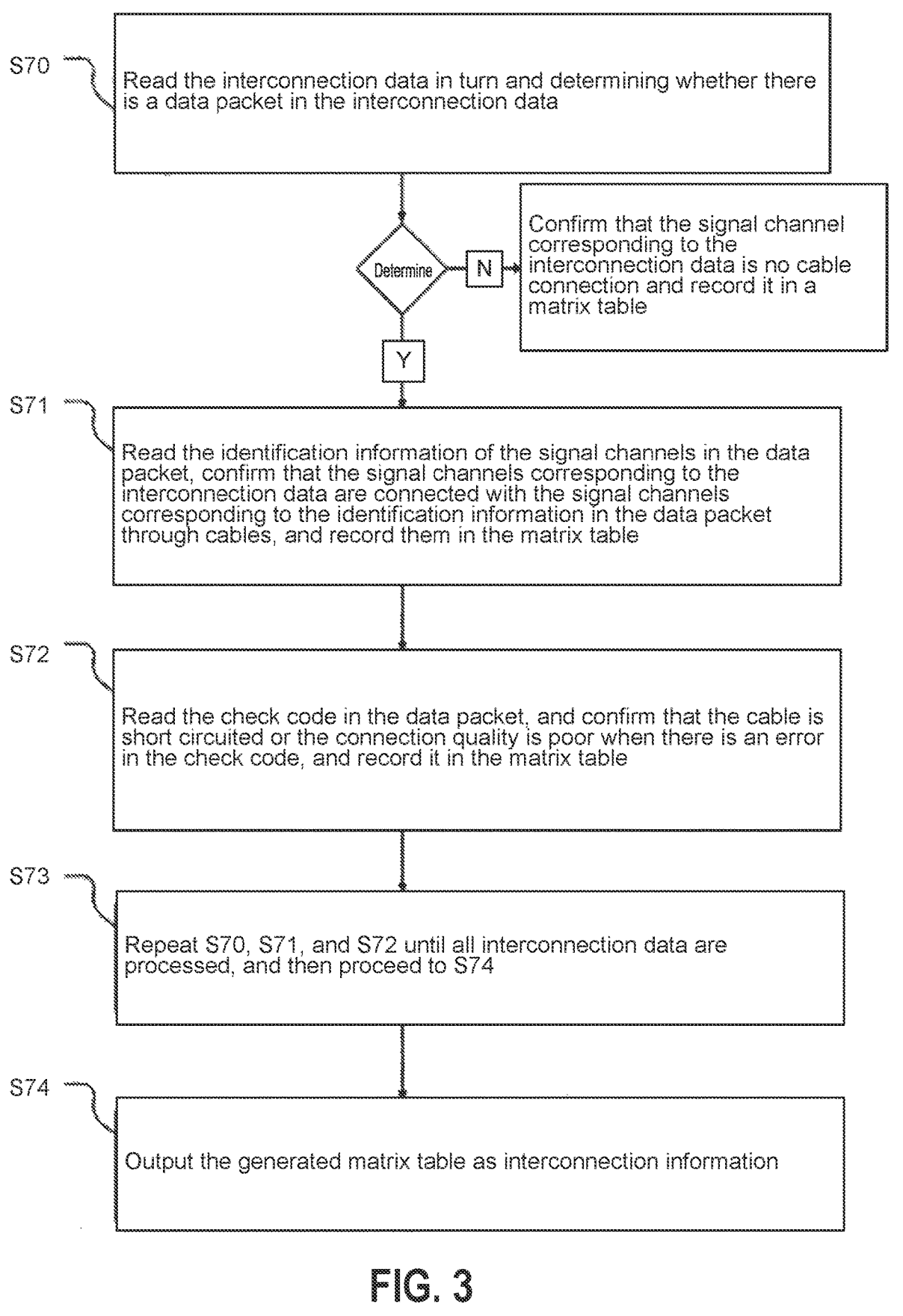

S70 — Read the interconnection data in turn and determining whether there is a data packet in the interconnection data Determine — N → Confirm that the signal channel corresponding to the interconnection data is no cable connection and record it in a matrix table

Y

S71 — Read the identification information of the signal channels in the data packet, confirm that the signal channels corresponding to the interconnection data are connected with the signal channels corresponding to the identification information in the data packet through cables, and record them in the matrix table S72 — Read the check code in the data packet, and confirm that the cable is short circuited or the connection quality is poor when there is an error in the check code, and record it in the matrix table S73 — Repeat S70, S71, and S72 until all interconnection data are processed, and then proceed to S74

S74 — Output the generated matrix table as interconnection information

FIG. 3

NETWORKING DETECTION METHOD AND SYSTEM

TECHNICAL FIELD

The application relates to the technical field of electronic design automation, in particular to a networking detection method and system.

BACKGROUND OF THE INVENTION

With the development of the chip industry, the integration of chips is getting higher and higher, and the scale of logic gates is getting larger and larger, which also poses a challenge to the verification of logic design. In the prototype verification based on programmable logic array (FPGA), it is often encountered that FPGA resources cannot meet the needs. At this time, it is necessary to adopt multiple FPGAs and form larger logic resources through networking and interconnection of input/output (IO) ports to meet the design needs. Because different logical designs have different topological requirements for networking, for example, some use star topology, others use matrix topology and some use queue topology. Therefore, in the prior art, all IO port resources of each FPGA are grouped according to a certain fixed number (commonly between 32 and 160) and connected to cable sockets, and then cables are connected between the sockets to realize a flexible topology.

In the actual operation flow of connecting cables, there are usually two ways: the first way is to give the relationship and number of connecting cables between different FPGAs according to the design topology, assign specific sockets, and query the pin location of the FPGA corresponding to the IO port contained in the sockets, and assign it to the FPGA pin constraint file (design constraint, XDC), and generate the corresponding bit stream to program and download the FPGA according to the requirements of the constraint file. Then connect these sockets with cables to work. However, in practical application, there is the following risk: when the cable connection is wrong, there is the risk of multi-drive of IO output, which will damage the FPGA chip. Therefore, before the actual FPGA logic works, it is necessary to detect the cable interconnection relationship to ensure the correct interconnection.

The second method is to connect the cables according to the approximate topological relationship, then detect the cable interconnection relationship, generate an interconnection table, and query the FPGA IO PIN location corresponding to the IO port contained in the socket, and allocate it to the FPGA pin constraint file (design constraint, XDC), and generate a corresponding bit stream to program and download the FPGA according to the requirements of the constraint file. Similarly, in order to avoid the risk of interconnection errors, before the actual logic works, it is necessary to detect the cable relationship and ensure that it is correct. In the above two processes, it is necessary to identify the position and connection relationship of each signal line, and generate constraint files. In the case of using design segmentation, such as RTL segmentation and netlist segmentation, it is also necessary to generate the top-level interconnection file of hardware system description language (HDL) for subsequent dynamic simulation. The existing methods all use manual input recognition, which is not only troublesome, but also has high error probability.

On the other hand, in the FPGA interconnection system, it is often necessary to detect the reliability of the interconnection cable, and whether the cable is open or short-circuited. For the detection of cable interconnection, two methods are generally used: visual appearance detection and multimeter measurement detection. Visual appearance detection is used to detect whether there is cable interconnection and lead breakage between connectors. Multimeter detection is to measure the two ends of the connector connected with the cable with the ohm gear of the multimeter, and the connected resistance value should be less than $0.5\Omega$. Although the operation of visual appearance detection is simple, the accuracy cannot be guaranteed. The multimeter has high detection accuracy, but it needs to be measured manually. Moreover, for the connector with high integration and bottom patch mode, the pins are not all exposed, so it is difficult for the multimeter's hands to measure signals.

BRIEF SUMMARY OF THE INVENTION

In view of this, embodiments of the present application provide a networking detection method and system, which at least partially solve the problems existing in the prior art.

The technical scheme specifically includes: a networking detection method is applied to a prototype verification system based on a programmable logic array, wherein the prototype verification system includes a plurality of system single boards and an upper computer, and the tipper computer is respectively connected with the system single boards in communication.

The system single board includes a controller and a plurality of programmable logic arrays connected with the controller, each programmable logic array includes a plurality of connectors, and each connector includes a plurality of signal channels, and the signal channels are correspondingly connected among the connectors through cable arrangement, and the signal channels are used for receiving and sending signals.

It further includes the following steps: Step S1, the upper computer allocates identification information for each system single board, programmable logic array and signal channel, and loads the identification information into the corresponding controller, wherein the identification information of the signal channel includes the identification information of the system single board and the identification information of the programmable logic array; Step S2, the signal channels are uniformly set to receive signal mode; Step S3, detect whether the signal channel receives a data packet; if so, switch to the next signal channel and return to Step S3; if not, proceed to Step S4; Step S4, switch the current signal channel to the sending signal mode, and send a data packet through this signal channel, then switch to the next signal channel and return to Step S3, wherein the data packet includes the identification information and check code of the signal channel; Step S5, repeat Step S3 to Step S4 until all signal channels are detected, and then turn to Step S6; Step S6, the controller collects the identification information of each signal channel and the data packet received by the corresponding signal channel to generate an interconnection data, and sends the interconnection data to the upper computer; Step S7, the upper computer processes the interconnection data to obtain interconnection information; Step S8, automatically generate a hardware system description language file for describing networking connection according to the interconnection information and the hardware system description language template.

Preferably, the Step S7 further includes: Step S70, read the interconnection data in turn and determine whether there is a data packet in the interconnection data: if it does not exist, the signal channel corresponding to the interconnection data is confirmed as no cable connection and recorded in a matrix table; if it exists, turn to step S71.

The Step S7 further includes: Step S71, read the identification information of the signal channels in the data packet, confirm that the signal channels corresponding to the interconnection data are connected with the signal channels corresponding to the identification information in the data packet through cables, and record them in the matrix table; Step S72, read the check code in the data packet, and confirm that the cable is short circuited or the connection quality is poor when there is an error in the check code, and record it in the matrix table; Step S73, Step S70 to Step S72 are repeated until all interconnection data are processed, and then the process goes to Step S74; Step S74, the generated matrix table is output as interconnection information.

Preferably, only one of the signal channels in each connector is selected for detection in Step S3 to Step S4 to generate interconnection data corresponding to each connector; determine whether there is a data packet in the interconnection data. If it does not exist, the connector corresponding to the interconnection data is confirmed as not connected by cable and recorded in the matrix table. If it exists, the identification information of the signal channel in the data packet is read, and the connector corresponding to the interconnection data is confirmed to be connected with the connector corresponding to the identification information in the data packet through a cable, and recorded in the matrix table.

Preferably, the controller is simultaneously connected with the programmable logic array through a control interface and a configuration interface.

Preferably, the data packet further includes a packet header and a counter, and the counter is used to characterize the stability of the networking.

A networking detection system is applied to a prototype verification system based on a programmable logic array, which includes a plurality of system single board and an upper computer, and the upper computer is respectively connected with the system single boards in communication.

The system single board includes a controller and a plurality of programmable logic arrays connected with the controller, each programmable logic array includes a plurality of connectors, and each connector includes a plurality of signal channels, and the signal channels are correspondingly connected among the connectors through cable arrangement, and the signal channels are used for receiving and sending signals.

The tipper computer further includes: an allocation unit is used for allocating identification information for each system single board, the programmable logic array and the signal channel, wherein the identification information of the signal channel includes identification information of the system single board and identification information of the programmable logic array; a sending unit, connected to the allocation unit, for sending identification information to the corresponding controller.

The controller further includes: a setting unit, is used for configuring to uniformly set the signal channels to a receiving signal mode; a detection unit is used for sequentially detecting whether the signal channel receives a data packet; a switching unit, connected to the detection unit, switches the signal channel that has not received the data packet to the signal transmission mode, and transmits the data packet through the signal channel, wherein the data packet includes the identification information of the signal channel and the check code; an acquisition unit is used for acquiring the identification information of each signal channel and the data packet received by the corresponding signal channel to generate an interconnection data, and sending the interconnection data to the upper computer.

The tipper computer further includes a processing unit for processing interconnection data to obtain interconnection information, a generating unit, connected with the processing unit, for automatically generating a hardware system description language file for describing networking connection according to the interconnection information and the hardware system description language template.

Preferably, the processing unit further includes: a reading module is used for reading the interconnection data in turn; a determining module, connected to the reading module, is used for determining whether there is a data packet in the interconnection data and outputting a determining result; a recording module, which is connected with the determining module and the reading module. When the decision result indicates that there is no cable connection, confirm that the signal channel corresponding to the interconnection data is not connected, and record it in a Matrix table. When the decision result indicates that there is, read the identification information of the signal channel in the data packet, confirm that the signal channel corresponding to the interconnection data is connected with the signal channel corresponding to the identification information in the data packet through the cable, and record it in the matrix table.

The processing unit further includes: a check module connected with the recording module and the reading module. The check module reads the check code in the data packet, and confirms that the cable is short circuited or the connection quality is poor when there is an error in the check code, and records it in the matrix table.

Preferably, only one signal channel in each connector is selected for detection to generate interconnection data corresponding to each connector; to determine whether there is a data packet in the interconnection data. If it does not exist, the connector corresponding to the interconnection data is confirmed as not connected by cable, and recorded in the matrix table. If it exists, the identification information of the signal channel in the data packet is read, and the connector corresponding to the interconnection data is confirmed to be connected with the connector corresponding to the identification information in the data packet through a cable, and recorded in the matrix table.

Preferably, the controller is simultaneously connected with the programmable logic array through a control interface and a configuration interface.

Preferably, the data packet further includes a packet header and a counter, and the counter is used to characterize the stability of networking.

The technical scheme has the following benefits. A networking detection method and system are provided to realize interconnection detection between connectors and signal channels, and automatically generate hardware system description language files, without manual measurement and input, and without the limitation of development board installation environment, with fast generation speed and high accuracy. At the same time, in the process of interconnection detection, it can accurately determine whether there is a short circuit or poor connection quality of the cable, and accurately locate the faulty cable.

BRIEF DESCRIPTION OF THE DRAWINGS

In order to explain the technical scheme of the embodiment of the application more clearly, the drawings needed in the embodiment will be briefly introduced below. Obviously, the drawings in the following description are only some embodiments of the application. For ordinary people in the field, other drawings can be obtained according to these drawings without creative work.

FIG. 2 is a schematic flow diagram of a networking detection method in an embodiment of the present invention;

FIG. 3 is a step-by-step flowchart of Step S7 based on FIG. 2 in the embodiment of the present invention;

DETAILED DESCRIPTION OF THE INVENTION

The embodiments of the present application will be described in detail with the drawings.

The following describes the implementation of the application through specific embodiments, and those skilled in the art can easily understand other advantages and effects of the application from the contents disclosed in this specification. Obviously, the described embodiment is only a part of the embodiment of this application, not the whole embodiment. This application can also be implemented or applied through different specific embodiments, and the details in this specification can be modified or changed based on different viewpoints and applications without departing from the spirit of this application. It should be noted that the following embodiments and features in the embodiments can be combined with each other without conflict. Based on the embodiments in this application, all other embodiments obtained by ordinary technicians in this field without creative work belong to the protection scope of this application.

It is noted that various aspects of the embodiments within the scope of the appended claims are described below. It should be obvious that the aspects described herein can be embodied in a wide variety of forms, and any specific structure and/or function described herein is merely illustrative. Based on this application, those skilled in the art should understand that one aspect described herein can be implemented independently of any other aspect, and two or more of these aspects can be combined in various ways. For example, devices and/or practice methods may be implemented using any number and aspects set forth herein. In addition, the apparatus and/or the method may be implemented using other structures and/or functionalities than one or more of the aspects set forth herein.

It should also be noted that the diagrams provided in the following examples only illustrate the basic concept of this application in a schematic way, and only the components related to this application are shown in the diagrams, instead of being drawn according to the number, shape and size of components in actual implementation. In actual implementation, the types, numbers and proportions of components can be changed at will, and the layout of components may be more complicated.

In addition, in the following description, specific details are provided to facilitate a thorough understanding of the examples. However, it will be understood by those skilled in the art that aspects may be practiced without these specific details.

The contents disclosed in this application are suitable for FPGA networking detection using various digital IO interconnections such as LVDS/SSTL/LV LVCMOS/TTL, including single ended or differential modes.

Figure 1:
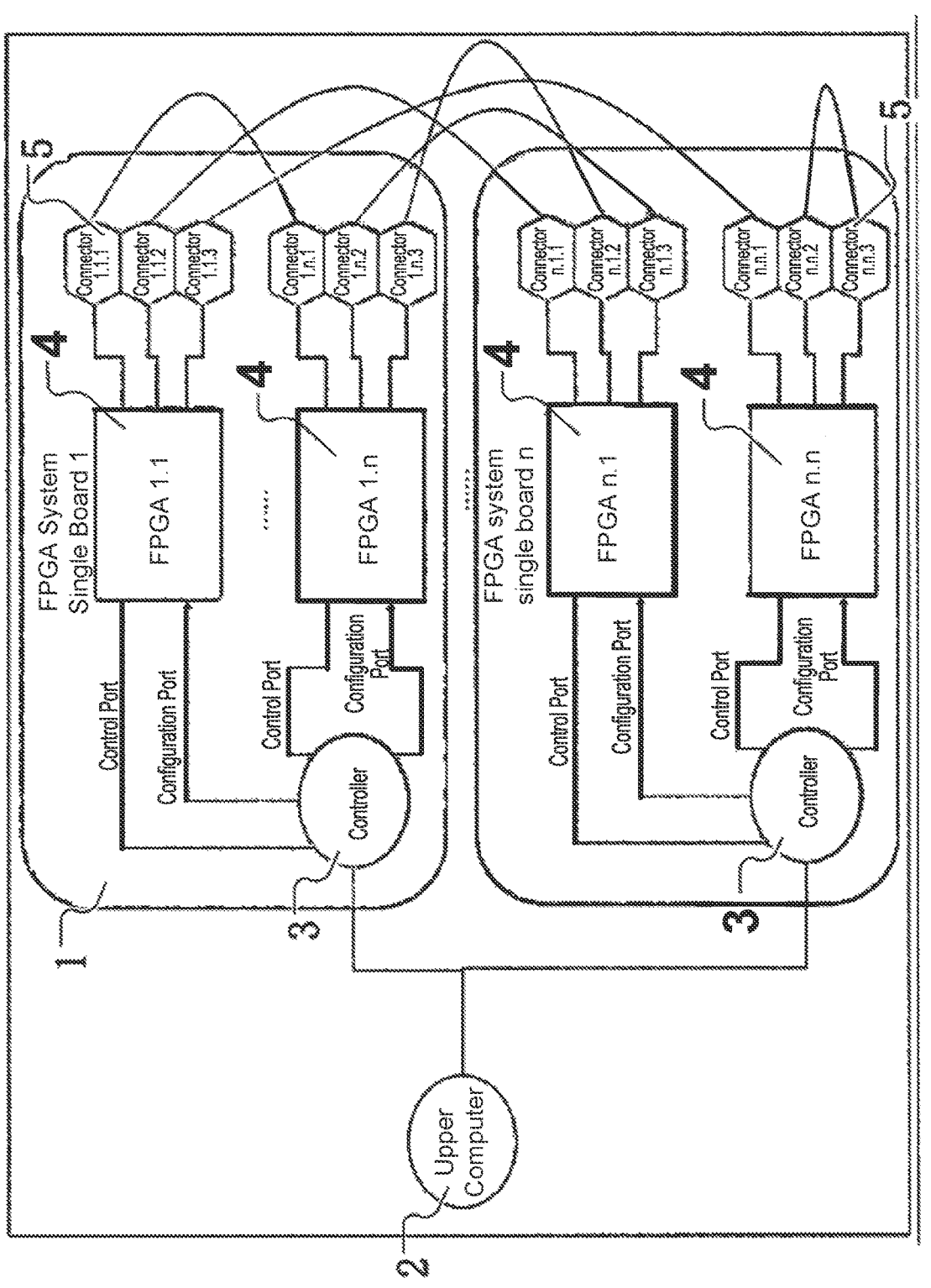
FIG. 1 is a schematic structural diagram of a networking detection system in an embodiment of the present invention.

A networking detection method is applied to a prototype verification system based on a programmable logic array 4, as shown in FIG. 1, wherein the prototype verification system includes a plurality of system single boards 1 and an tipper computer 2, and the tipper computer 2 is respectively connected with the system single boards 1 in communication:

The system single board 1 includes a controller 3 and a plurality of programmable logic arrays 4 connected with the controller 3, each programmable logic array 4 includes a plurality of connectors 5, and each connector 5 includes a plurality of signal channels, and the signal channels are correspondingly connected among the connectors 5 through cable arrangement, and the signal channels are used for receiving and sending signals;

Specifically, the prototype verification system includes five levels: the upper computer 2, the FPGA system single board 1, the programmable logic array 4, the connector 5, and the signal channels on the connector 5. Each signal channel has two modes of input and output, and can be freely switched between the two modes under the control of the controller 3. The input mode is used for receiving signals, and the output mode is used for sending signals.

In a specific embodiment of the present invention, each connector 5 includes a plurality of signal channels, that is, IO channels. All connectors 5 include the same number of signal channels and the same arrangement order. When two connectors 5 are connected to each other through a cable arrangement, the signal channels are also connected correspondingly. Each programmable logic array 4 includes a plurality of connectors 5, and each system board 1 is provided with a plurality of programmable logic arrays 4. The tipper computer 2 can be realized by computer, server, industrial computer or MCU.

As shown in FIG. 2, the networking detection method disclosed in this application further includes the following steps:

Step S1, the upper computer 2 allocates identification information for each system single board 1, programmable logic array 4 and signal channel, and loads the identification information into the corresponding controller 3;

The identification information of the signal channel includes the identification information of the system single board 1 and the identification information of the programmable logic array 4;

In a specific embodiment of the present invention, a detection special program file for is designed, and the logic program file is downloaded to each programmable logic array 4 through the upper computer 2 and the controller 3, so as to realize the function of independently controlling each signal channel to send and receive data. Subsequently, the upper computer 2 sequentially numbers the components in the system. Firstly, number the system single board 1, then number the programmable logic arrays 4 in the single board based on the number of the system single board 1, and finally number each programmable logic array 4 and the signal channels in the array. Therefore, the number of each signal channel includes: system single board 1 number+ FPGA number+connector 5 number+signal channel number, thus forming unique identification information, and the information of system single board 1, programmable logic array 4 and connector 5 to which the signal channel belongs can be obtained from the identification information of the signal channel.

Step S2, the signal channels are uniformly set to receive signal mode;

Step S3, detect whether the signal channel receives a data packet;

If so, switch to the next signal channel and return to Step S3;

If not, proceed to Step S4;

Step S4, switch the current signal channel to the sending signal mode, and send a data packet through this signal channel, then switch to the next signal channel and return to Step S3, wherein the data packet includes the identification information and check code of the signal channel;

Step S5, repeat Step S3 to Step S4 until all signal channels are detected, and then turn to Step S6;

In a specific embodiment of the present invention, each signal channel further includes a register, a receiver and a transmitter. After the controller 3 downloads the identification information, which is the number, of the signal channel from the upper computer 2, the number is correspondingly stored in the corresponding signal channel register. Subsequently, the controller 3 uniformly configures all the signal channels in the input mode, so that the receiver is ready to receive the signal, and resets the receiver, and clear all the data.

After entering the detection program, the upper computer 2 sends relevant instructions, and the controller 3 realizes the following functions through the internal control logic of the programmable logic array 4. Firstly, detect whether a data packet is received in the receiver of a signal channel. If the data packet already exists in the receiver, it can be considered that the signal channel has received the data packet sent by other signal channels through cables, and then it can be considered that the signal channel is connected with the signal channel that sent the data packet. The detection of this signal channel is skipped and the detection of the next signal channel is performed. If it is not received, it means that the channel cannot determine whether it is connected with other signal channels through cables. At this time, the controller 3 switches the signal channel from the receiving mode to the sending mode, and at this time, the transmitter constructs a data packet including the signal channel identification information and the check code and sends the data packet. Since all other signal channels are receiving signals at this time, if the signal channel is connected with other signal channels through cables, the receiver of the connected signal channel will receive the data packet. According to the above method, all signal channels are detected in turn until all signal channels are detected, and then the next step is entered.

Step S6, the controller 3 collects the identification information of each signal channel and the data packet received by the corresponding signal channel to generate an interconnection data, and sends the interconnection data to the upper computer 2;

Specifically, in this embodiment, after all the signal channels are detected, the tipper computer 2 issues an instruction, and the controller 3 collects and packages the received information of the signal channels in each connector 5 into interconnection data through the control logic in the programmable logic array 4, and sends it to the upper computer 2 for processing and analysis.

Step S7, the upper computer 2 processes the interconnection data to obtain interconnection information;

Step S8, automatically generate a hardware system description language file for describing networking connection according to the interconnection information and the hardware system description language template.

Specifically, in this embodiment, generate interconnection information according to the collected interconnection data, and the interconnection information is filled into a hardware description language template to automatically generate a hardware description language file, wherein the connector 5 is embodied as a bus signal type. After obtaining the hardware description language file, the upper computer 2 software can be quickly called for subsequent design and simulation, which greatly improves the development efficiency.

In the preferred embodiment of the present invention, as shown in FIG. 3, step S7 further includes:

Step S70, read the interconnection data in turn and determine whether there is a data packet in the interconnection data:

If it does not exist, the signal channel corresponding to the interconnection data is confirmed as no cable connection and recorded in a matrix table;

If it exists, turn to step S71;

Step S71, read the identification information of the signal channels in the data packet, confirm that the signal channels corresponding to the interconnection data are connected with the signal channels corresponding to the identification information in the data packet through cables, and record them in the matrix table;

Step S72, read the check code in the data packet, and confirm that the cable is short circuited or the connection quality is poor when there is an error in the check code, and record it in the matrix table;

Step S73, Step S70 to Step S72 are repeated until all interconnection data are processed, and then the process goes to Step S74;

Step S74, the generated matrix table is output as interconnection information.

Specifically, in this embodiment, the interconnection data corresponding to each signal channel is processed in turn, and the processing results are filled into a matrix table, wherein the matrix table is a table with the number of each signal channel as the horizontal and vertical coordinates, and the space where the numbers of two signal channels intersect is filled with connection information and signal quality information, so as to record the interconnection relationship among the signal channels and the quality of the connection.

The data packet contains a check code, and the upper computer 2 will check the check code in the received data packet. If the check code is wrong, it is considered that there may be an open circuit or poor signal quality in two signal channels connected by cables, and the user can directly locate the specific cable for physical inspection and correction according to the check information, thus realizing the function of accurately locating the faulty cable.

In the preferred embodiment of the present invention, only one of the signal channels in each connector 5 is selected for detection in Step S3 to Step S4 to generate interconnection data corresponding to each connector 5;

Determine whether there is a data packet in the interconnection data:

If it does not exist, the connector 5 corresponding to the interconnection data is confirmed as not connected by cable and recorded in the matrix table;

If it exists, the identification information of the signal channel in the data packet is read, and the connector 5 corresponding to the interconnection data is confirmed to be connected with the connector 5 corresponding to the identification information in the data packet through a cable, and recorded in the matrix table.

Specifically, in this embodiment, due to the connectors 5 are integrally connected by cable arrangement, detect only one signal channel in the connectors 5 as a representative without the need to determine whether the cable connection between each signal channel in the connectors 5 is good or not. If the signal channel is connected with another signal channel, it is considered that the connector 5 where the signal channel is located is connected with the connector 5 where the other signal channel is located. In this embodiment, the connector 5 is used as the minimum connection unit, and the pin constraint file can obtain the pin constraints of other signal channels according to the information of the connector 5 and the circuit board. This embodiment can improve the detection speed.

In the preferred embodiment of the present invention, the controller 3 is simultaneously connected with the programmable logic array 4 through a control interface and a configuration interface.

Specifically, in this embodiment, the controller 3 and each programmable logic array 4 have two groups of connections, the first group connection is a dedicated connection port for downloading configuration, and the second group connection is a bidirectional port for control. The controller 3 is also connected to the upper computer 2 through an uplink port, which can be one of an Ethernet port, an RS-485 port or a USB port.

In the preferred embodiment of the present invention, the data packet further includes a packet header and a counter, and the counter is used to characterize the stability of the networking.

Specifically, in this embodiment, the data packet consists of a packet header, identification information, a counter and a check code, and the data has a self-synchronization function, so that the packet header can be easily identified, and the method of data self-synchronization is the prior art, which is not repeated here. Every time a data is sent, the counter will be increased by one. If the receiving end detects that the packet counters received before and after are discontinuous, it is considered that a data transmission error has occurred. Finally, the bit error rate is calculated according to the sum of the number of errors and the sum of all sent packets, thereby representing the stability of the networking.

Figure 4:
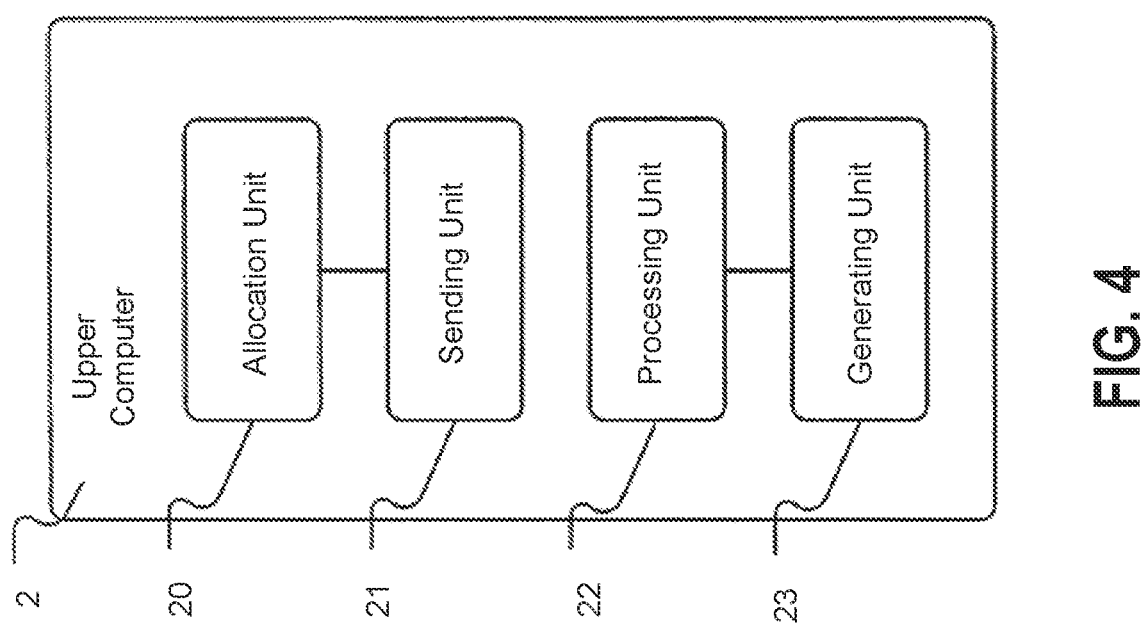
FIG. 4 is a schematic diagram of the internal structure of the upper computer in the embodiment of the present invention.
Figure 5:
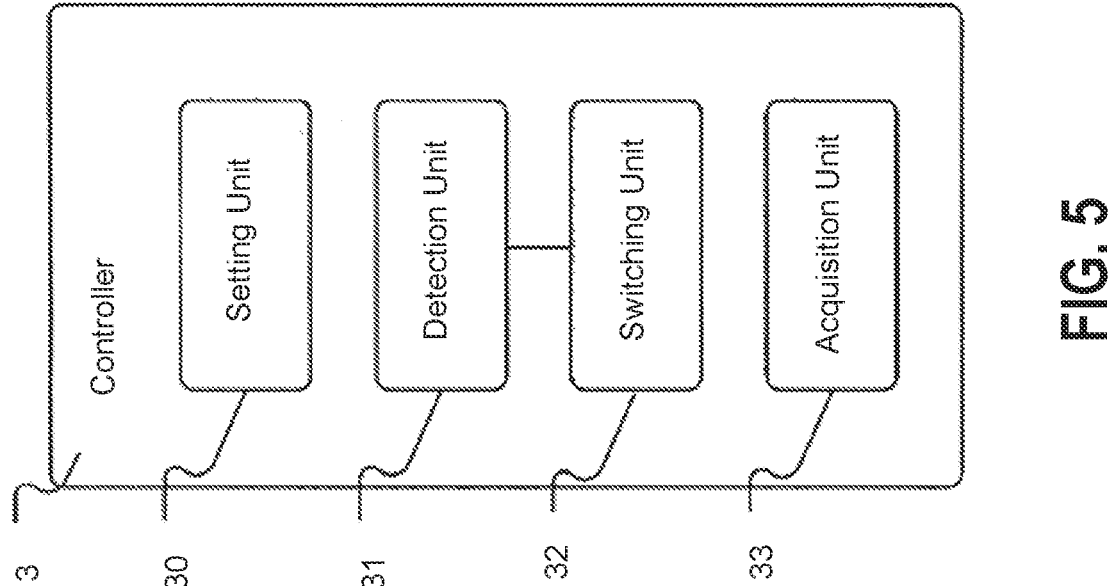
FIG. 5 is a schematic diagram of the internal structure of the controller in the preferred embodiment of the present invention.

A networking detection system is applied to a prototype verification system based on a programmable logic array 4, as shown in FIG. 1, which includes a plurality of system single board 1 and an upper computer 2, and the upper computer 2 is respectively connected with the system single boards 1 in communication;

The system single board 1 includes a controller 3 and a plurality of programmable logic arrays 4 connected with the controller 3, each programmable logic array 4 includes a plurality of connectors 5, and each connector 5 includes a plurality of signal channels, and the signal channels are correspondingly connected among the connectors 5 through cable arrangement, and the signal channels are used for receiving and sending signals;

As shown in FIG. 4, the upper computer 2 further includes:

an allocation unit 20 is used for allocating identification information for each system single board 1, the programmable logic array 4 and the signal channel, wherein the identification information of the signal channel includes identification information of the system single board 1 and identification information of the programmable logic array 4;

a sending unit 21, connected to the allocation unit 20, for sending identification information to the corresponding controller 3;

As shown in FIG. 5, the controller 3 further includes: a setting unit 30, is used for configuring to uniformly set the signal channels to a receiving signal mode, a detection unit 31 is used for sequentially detecting whether the signal channel receives a data packet; a switching unit 32, connected to the detection unit 31, switches the signal channel that has not received the data packet to the signal transmission mode, and transmits the data packet through the signal channel, wherein the data packet includes the identification information of the signal channel and the check code; an acquisition unit 33 is used for acquiring the identification information of each signal channel and the data packet received by the corresponding signal channel to generate an interconnection data, and sending the interconnection data to the upper computer 2.

The upper computer 2 further includes a processing unit 22 for processing interconnection data to obtain interconnection information, a generating unit 23, connected with the processing unit 22, for automatically generating a hardware system description language file for describing networking connection according to the interconnection information and the hardware system description language template.

As a preferred embodiment, each programmable logic array has a corresponding hardware description file, such as:

```
module FPGA(
inout[63 : 0] connector1 ;
    inout[63:0] connector2
a top-level hardware description file, such as:
module system_top (
)
FPGA FPGA1(connector1(con1_1), connector2(con1_2));
FPGA FPGA2(connector1(con2_1), connector2(con2_2));
......
FPGA FPGAn(connector1(conn_1), connector2(conn 2));
```

According to the detected interconnection matrix, make connections to realize the connection from output to input, for example:

```
assign con1_1==con2_2.
```

Figure 6:
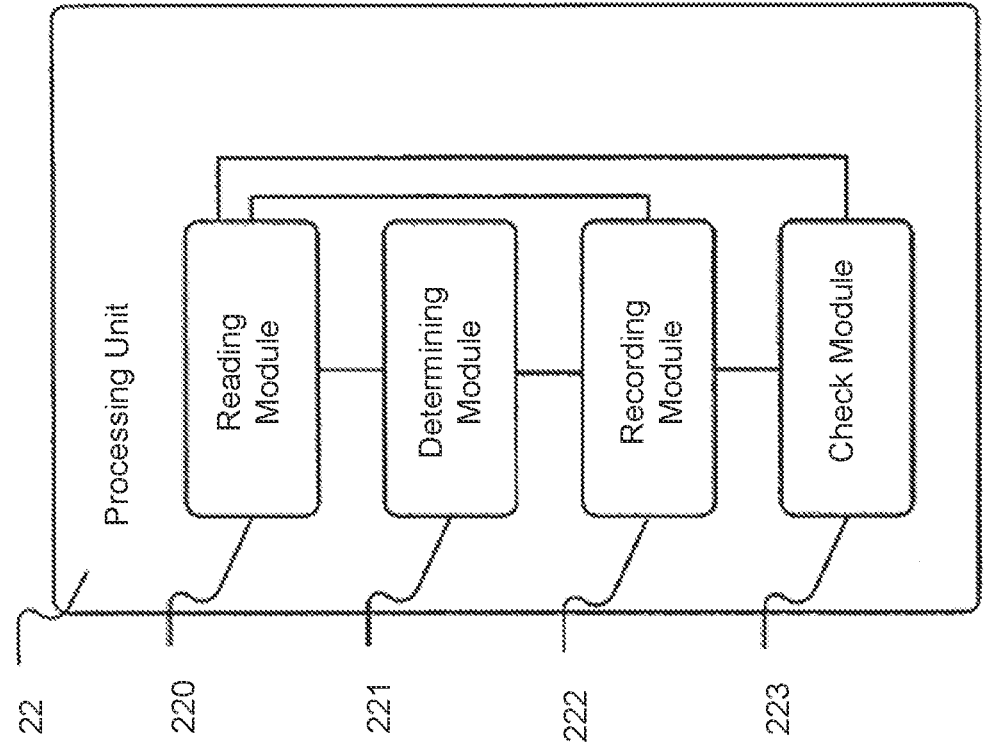
FIG. 6 is a schematic diagram of the internal structure of the processing unit in the preferred of the present invention.

In the preferred embodiment of the present invention, as shown in FIG. 6, the processing unit 22 further includes: a reading module 220 is used for reading the interconnection data in turn; a determining module 221, connected to the reading module 220, is used for determining whether there is a data packet in the interconnection data and outputting a determining result; a recording module 222, which is connected with the determining module 221 and the reading module 220. When the decision result indicates that there is no cable connection, confirm that the signal channel corresponding to the interconnection data is not connected, and record it in a Matrix table. When the decision result indicates that there is, read the identification information of the signal channel in the data packet, confirm that the signal channel corresponding to the interconnection data is connected with the signal channel corresponding to the identification information in the data packet through the cable, and record it in the matrix table. The processing unit 22 further includes: a check module 223 is connected with the recording module 222 and the reading module 220, reads the check code in the data packet, and confirms that the cable is short circuited or the connection quality is poor when there is an error in the check code, and records it in the matrix table.

In the preferred embodiment of the present invention, only one signal channel in each connector 5 is selected for detection to generate interconnection data corresponding to each connector 5; determine whether there is a data packet in the interconnection data. If it does not exist, the connector 5 corresponding to the interconnection data is confirmed as not connected by cable, and recorded in the matrix table. If it exists, the identification information of the signal channel in the data packet is read, and the connector 5 corresponding to the interconnection data is confirmed to be connected with the connector 5 corresponding to the identification information in the data packet through a cable, and recorded in the matrix table.

In the preferred embodiment of the present invention, the controller 3 is simultaneously connected with the programmable logic array 4 through a control interface and a configuration interface.

In the preferred embodiment of the present invention, the data packet further includes a packet header and a counter, and the counter is used to characterize the stability of the networking.

The technical scheme has the following benefits. A networking detection method and system are provided to realize interconnection detection between connectors and signal channels, and automatically generate hardware system description language files, without manual measurement and input, and without the limitation of development board installation environment, with fast generation speed and high accuracy. In the process of interconnection detection, it can accurately determine whether the cable has short circuit or poor connection quality.

The above is only the specific implementation of this application, but the protection scope of this application is not limited to this. Any change or replacement that can be easily thought of by a person familiar with this technical field within the technical scope disclosed in this application should be included in the protection scope of this application. Therefore, the protection scope of this application should be based on the protection scope of the claims.

What is claimed is:

1. A networking detection method applied to a prototype verification system based on a programmable logic array, characterized in that, the prototype verification system includes a plurality of system single boards and an upper computer, and the upper computer is respectively connected with the plurality of system single boards and in communication with the plurality of system single boards; and each of the plurality of system single boards includes a controller and a plurality of programmable logic arrays connected with the controller, each of the plurality of programmable logic array includes a plurality of connectors, and each of the plurality of connectors includes a plurality of signal channels, and the signal channels are correspondingly connected among the plurality of connectors through cable arrangement, and the plurality of signal channels are used for receiving and sending signals;

the networking detection method includes the following steps:
(Step S1) allocating, by the upper computer, identification information for each of the plurality of system single boards, each of the plurality of programmable logic arrays, and each of the plurality of signal channels, and loading, by the upper computer, the identification information into the corresponding controller, wherein the identification information of each of the plurality of signal channels includes the identification information of each of the plurality of system single boards and the identification information of each of the plurality of programmable logic arrays;
(Step S2) uniformly setting the signal channels to a signal receiving mode;
(Step S3) detecting whether the signal channels receive a data packet; if so, switching to the next signal channel and returning to Step S3; if not, proceeding to Step S4;
(Step S4) switching the current signal channel to a signal sending mode, and sending a data packet through the current signal channel, then switching to the next signal channel and return to Step S3, wherein the data packet includes the identification information and check code of the current signal channel;
(Step S5) repeating Step S3 to Step S4 until all of the plurality of signal channels are detected, and then turning to Step S6;
(Step S6) collecting, by the controller, the identification information of each of the plurality of signal channels and the data packet received by the corresponding signal channel to generate an interconnection data, and sending the interconnection data to the upper computer;
(Step S7) processing, by the upper computer, the interconnection data to obtain interconnection information; and
(Step S8) automatically generating a hardware system description language file for describing networking connection according to the interconnection information and the hardware system description language file.

2. The networking detection method according to claim 1, characterized in that, the Step S7 further includes:
(Step S70) reading the interconnection data in turn and determining whether there is a data packet in the interconnection data; if the data packet does not exist, the signal channel corresponding to the interconnection data is confirmed as no cable connection and recorded in a matrix table; if the data packet exists, turning to step S71;
(Step S71) reading the identification information of the signal channels in the data packet, confirming that the signal channels corresponding to the interconnection data are connected with the signal channels corresponding to the identification information in the data packet through cables, and recording them in the matrix table;
(Step S72) reading the check code in the data packet, and confirming that the cable is short circuited or the connection quality is poor when there is an error in the check code, and recording it in the matrix table;
(Step S73) repeating Step S70, Step S71, and Step S72 until all interconnection data are processed, and then proceeding to Step S74; and
(Step S74) outputting the generated matrix table as interconnection information.

3. The networking detection method according to claim 2, characterized in that, only one of the signal channels in each connector is selected for detection in Step S3 and Step S4 to generate interconnection data corresponding to each connector;
the networking detection method further comprises:
determining whether there is a data packet in the interconnection data;

if the data packet does not exist, the connector corresponding to the interconnection data is confirmed as not connected by cable and recorded in the matrix table; and if the data packet exists, the identification information of the signal channel in the data packet is read, and the connector corresponding to the interconnection data is confirmed to be connected with the connector corresponding to the identification information in the data packet through a cable, and recording them in the matrix table.

4. The networking detection method according to claim 1, characterized in that, the controller is simultaneously connected with the programmable logic array through a control interface and a configuration interface.

5. The networking detection method according to claim 1, characterized in that, the data packet further includes a packet header and a counter, and the counter is used to characterize networking stability.

6. A networking detection system applied to a prototype verification system based on a programmable logic array, characterized in that, the networking detection system includes:

a plurality of system single boards; and an upper computer, and wherein the upper computer is respectively connected with the plurality of system single boards and in communication with the plurality of system single boards; and wherein each of the plurality of system single boards includes a controller and a plurality of programmable logic arrays connected with the controller, each of the plurality of programmable logic array includes a plurality of connectors, and each of the plurality of connectors includes a plurality of signal channels, and the signal channels are correspondingly connected among the plurality of connectors through cable arrangement, and the plurality of signal channels are used for receiving and sending signals;

and wherein the upper computer further includes:

an allocation unit is used for allocating identification information for each of the plurality of system single boards, each of the plurality of programmable logic arrays, and each of the plurality of signal channels, wherein the identification information of each of the plurality of signal channels includes identification information of each of the plurality of system single boards and identification information of each of the plurality of programmable logic arrays;

a sending unit, connected to the allocation unit, for sending identification information to the corresponding controller;

and wherein the controller further includes:

a setting unit used for uniformly setting the signal channels to a signal receiving mode;

a detection unit used for sequentially detecting whether the signal channels receive a data packet;

a switching unit, connected to the detection unit, used for switching the signal channel that has not received the data packet to a signal transmission mode, and transmitting the data packet through the signal channel, wherein the data packet includes the identification information of the signal channel and the check code;

an acquisition unit used for acquiring the identification information of each of the plurality of signal channels and the data packet received by the corresponding signal channel to generate an interconnection data, and sending the interconnection data to the upper computer; and wherein the upper computer further includes:

a processing unit for processing interconnection data to obtain interconnection information; and a generating unit, connected with the processing unit, for automatically generating a hardware system description language file for describing networking connection according to the interconnection information and the hardware system description language file.

7. The networking detection system according to claim 6, characterized in that, the processing unit further includes:

a reading module, used for reading the interconnection data in turn;

a determining module, connected to the reading module, used for determining whether there is a data packet in the interconnection data and outputting a determining result;

a recording module, connected with the determining module and the reading module; wherein when the decision result indicates that there is no cable connection, confirming that the signal channel corresponding to the interconnection data is not connected, and recording it in a matrix table; when the decision result indicates that there is cable connection, reading the identification information of the signal channel in the data packet, confirming that the signal channel corresponding to the interconnection data is connected with the signal channel corresponding to the identification information in the data packet through the cable, and recording it in the matrix table;

a check module, connected with the recording module and the reading module, used for reading the check code in the data packet, and confirming that the cable is short circuited or the connection quality is poor when there is an error in the check code, and recording it in the matrix table.

8. The networking detection system according to claim 7, characterized in that, only one signal channel in each of the plurality of connectors is selected for detection to generate interconnection data corresponding to each connector;

the networking detection system is further configured to:

determine whether there is a data packet in the interconnection data;

if the data packet does not exist, the connector corresponding to the interconnection data is confirmed as not connected by cable and recorded in the matrix table; and if the data packet exists, the identification information of the signal channel in the data packet is read, and the connector corresponding to the interconnection data is confirmed to be connected with the connector corresponding to the identification information in the data packet through a cable, and recording them in the matrix table.

9. The networking detection method according to claim 6, characterized in that, the controller is simultaneously connected with the programmable logic array through a control interface and a configuration interface.

10. The networking detection method according to claim 6, characterized in that, the data packet further includes a packet header and a counter, and the counter is used to characterize networking stability.

* * * * *